United States Patent [19]

Miyazaki et al.

[11] Patent Number: 5,252,133
[45] Date of Patent: Oct. 12, 1993

[54] VERTICALLY ORIENTED CVD APPARATUS INCLUDING GAS INLET TUBE HAVING GAS INJECTION HOLES

[75] Inventors: Shinji Miyazaki, Yokohama; Yuichi Mikata, Kawasaki; Takahiko Moriya, Yokohama; Reiji Niino, Kofu; Motohiko Nishimura, Yamanashi, all of Japan

[73] Assignees: Kabushiki Kaisha Toshiba, Kawasaki; Tokyo Electron Limited, Tokyo, both of Japan

[21] Appl. No.: 809,122

[22] Filed: Dec. 18, 1991

[30] Foreign Application Priority Data

Dec. 19, 1990 [JP] Japan .................... 2-403943

[51] Int. Cl.⁵ .................................... C23C 16/00
[52] U.S. Cl. .................................... 118/725; 118/724; 118/715; 118/730
[58] Field of Search ............... 118/715, 719, 724, 725, 118/729, 730

[56] References Cited

U.S. PATENT DOCUMENTS 4,745,088  5/1988  Inoue et al. .
4,992,301  2/1991  Shishiguchi et al. ........ 118/724 X

FOREIGN PATENT DOCUMENTS

0164928A2  12/1985  European Pat. Off. .
0235728    10/1987  Japan .................... 118/730
0263629    11/1987  Japan .................... 118/730
64-37464    3/1989  Japan .
0081216     3/1989  Japan .................... 118/715
0235235     9/1989  Japan .................... 118/730
0009116     1/1990  Japan .................... 118/730
2155959A    10/1985 United Kingdom .

OTHER PUBLICATIONS

Stanley Wolf, Silicon Processing of the VLSI Era, 1986, p. 27.

Primary Examiner—Brian E. Hearn
Assistant Examiner—Jonathan D. Baskin
Attorney, Agent, or Firm—Finnegan, Henderson, Farabow, Garrett & Dunner

[57] ABSTRACT

A vertically oriented CVD apparatus comprises a reaction chamber, a boat means vertically placed in the reaction chamber to horizontally support a plurality of semiconductor substrates, and a gas inlet tube including a plurality of gas injection holes along a longitudinal axis thereof and extending along a longitudinal side of the boat means to introduce a reaction gas into the reaction chamber. In the structure, a direction of each of the gas injection holes is set at an angle $\theta$ with respect to a reference line given by a straight line connecting a center of the gas inlet tube to a center of one of the semiconductor wafers, the angle $\theta$ being defined by $0° < \theta \leq 90°$.

10 Claims, 10 Drawing Sheets

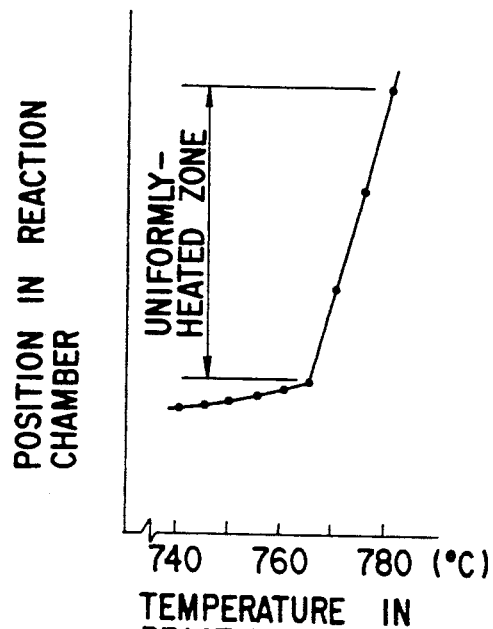
PRIOR ART
F I G. 10
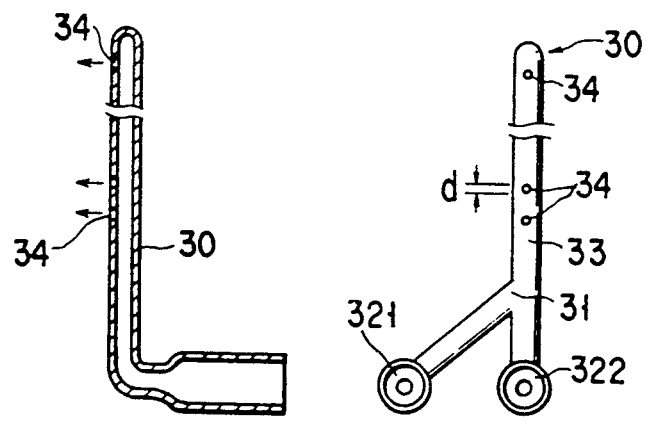
PRIOR ART
FIG. 11A
PRIOR ART
FIG. 11B

VERTICALLY ORIENTED CVD APPARATUS INCLUDING GAS INLET TUBE HAVING GAS INJECTION HOLES

BACKGROUND OF THE INVENTION

1. Field of the Invention

The present invention relates to a vertical-type CVD apparatus for forming films, such as silicon nitride films, on semiconductor substrates.

2. Description of the Prior Art

FIG. 9 schematically shows in cross section an example of a vertical-type CVD apparatus, which is a type of conventional CVD apparatus. Numeral 11 denotes an inner tube which is made of quartz, 12 an outer tube which is also made of quartz, 13 a manifold flange, 14 a cover, and 15 an O-ring. These components constitute a reduced pressure CVD chamber 10. A pedestal 17, which is coupled to a rotational mechanism 16 provided outside the CVD chamber 10, is arranged in the inner tube 11, and a quartz boat 18 is mounted on the pedestal 17. A heater 19 for keeping the CVD chamber 10 at a desired temperature is provided outside the chamber 10 (the temperature distribution within the chamber is as shown in FIG. 10, for example). In the uniformly-heated zone of the CVD chamber 10, a plurality of semiconductor substrates 20 are horizontally arranged parallel to each other and spaced a predetermined distance apart from one another. The manifold flange 13 has an exhaust port 21 to which an external exhaust means is coupled to maintain the chamber at a reduced pressure. The manifold flange 13 also has a plurality of raw gas inlet ports, for example, two raw gas inlet ports 221 and 222, through which gas inlet tubes 231 and 232 are inserted into the CVD chamber. At least one of the two gas inlet tubes (e.g., the tube 231) has a portion extending beside the substrates into the uppermost inner region of the reaction chamber. The gas inlet tube 231 has a closed distal end, and is also provided with gas injection holes 34 along its longitudinal direction. The other gas inlet tube 232 has a portion extending up to the pedestal 17 arranged in the inner tube 11. Reference numeral 24 denotes a transfer mechanism.

In the above-mentioned vertical-type CVD apparatus, raw gases (e.g., dichlorosilane gas and ammonia gas) are introduced into the chamber 10 through the gas inlet ports 221 and 222, whereby a CVD film (e.g., silicon nitride film) is deposited on each substrate 20.

The reason for locating the substrates 20 in the uniformly-heated zone is to prevent silicon nitride films, each being deposited on the substrates 20, from having a variation in the film thickness, based on their position in the boat 18.

As previously described, two independent gas inlet tubes 231 and 232 are used in the aforementioned CVD apparatus. The reason these two tubes are inserted into the interior of the inner tube 11 is to avoid unwanted ammonium chloride from being produced as a result of the aforementioned two raw gases being mixed in a low-temperature atmosphere in the vicinity of the cover 14.

In place of the two gas inlet tubes 231 and 232, a single gas inlet tube 30, shown in FIGS. 11A and 11B, can be used. The distal end of the tube 30 is closed, and the proximal end portion thereof is divided into two branches. An injector nozzle portion 33, which is at a higher positional level than a branch portion 31 of the gas inlet tube 30, has a plurality of gas injection holes 34, and raw gases are supplied independently through two gas inlet ports 321 and 322, which are provided at the distal end of each of the branches. It has been proposed that by using such a gas inlet tube, the raw gases with a uniform concentration can be supplied to the aforementioned uniformly-heated zone (Published Unexamined Japanese Utility Model Application 64-37464, for example).

The variation in the film thickness among the substrates can be controlled by use of the batch processing mentioned above. However, there is a problem such that a variation in essential properties (film quality and composition) of the deposited silicon nitride films is not negligible.

In order to investigate the variation in the properties of the silicon nitride film among the substrates, the hydrofluoric acid (HF) etching rate and the refractive index of the silicon nitride film relative to the position of the substrate 20 (the distance from the inlet port of the reaction chamber) were measured. The result of the measurements is shown in FIGS. 12 and 13. As can be clearly understood from these Figures, the composition of each silicon nitride film differs considerably from one another according to substrate positions.

The CVD films formed on substrates should ideally have a uniform thickness and composition. However, in the case of batch processing, as characteristically performed by the conventional vertical-type CVD apparatus, forming CVD films with a uniform thickness is the main consideration; the variation in film composition among the substrates is disregarded.

When the composition of the CVD films is intended to be uniform among the substrates by using the conventional CVD apparatus, the desired results can not be obtained even if the atmospheric condition and the flow rate of raw gases are changed. Therefore, it is necessary to keep the uniformly heated zone at a constant temperature without a temperature gradient. However, such a technique is not used because the throughput of the batch processing, which is a merit of the CVD apparatus, is remarkably reduced.

The problem described above may be somewhat improved if the gas inlet tube 30, whose proximal end portion is divided into two branches as shown in FIGS. 11A and 11B, is employed. However, if the gas inlet tube 30 is used, the thickness of the deposited CVD film is different between the central portion of the substrate and the peripheral portion. That is, the difference of the film thickness is considerably large within the plane of the substrate. This is because each of the gas injection holes faces toward the central axis of its corresponding substrate.

As described above, a conventional vertical-type CVD apparatus has the merits that CVD films can be formed on a plurality of substrates in a single batch and the films thus formed are of uniform in thickness, whereas it has the drawback that the characteristics of the formed CVD films differ.

SUMMARY OF THE INVENTION

It is therefore the object of the present invention to provide a vertical-type CVD apparatus capable of depositing a CVD film on a plurality of semiconductor substrates to have a uniform thickness and composition.

According to one aspect of the present invention, there is provided a vertically oriented CVD apparatus which comprises a reaction chamber, a boat means vertically placed in the reaction chamber to horizontally support a plurality of semiconductor substrates, and a gas inlet tube including a plurality of gas injection holes along a longitudinal axis thereof and also extending along a longitudinal side of the boat means to introduce a reaction gas into the reaction chamber. In such a structure, a direction of each of the gas injection holes is set at an angle $\theta$ with respect to a reference line given by a straight line connecting a center of the gas inlet tube to a center of one of the substrates, and further the angle $\theta$ is defined by $0° < \theta \leq 90°$.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 10 shows an example of a temperature distribution within a reaction chamber heated by a heating means of the CVD apparatus of FIG. 9;

FIGS. 11A and 11B are respectively sectional view and a side view of one gas inlet tube used in place of the two gas inlet tubes employed in the CVD apparatus of FIG. 9;

DETAILED DESCRIPTION OF THE PREFERRED EMBODIMENTS

An embodiment of the present invention will now be described with reference to the drawings.

Figure 1:
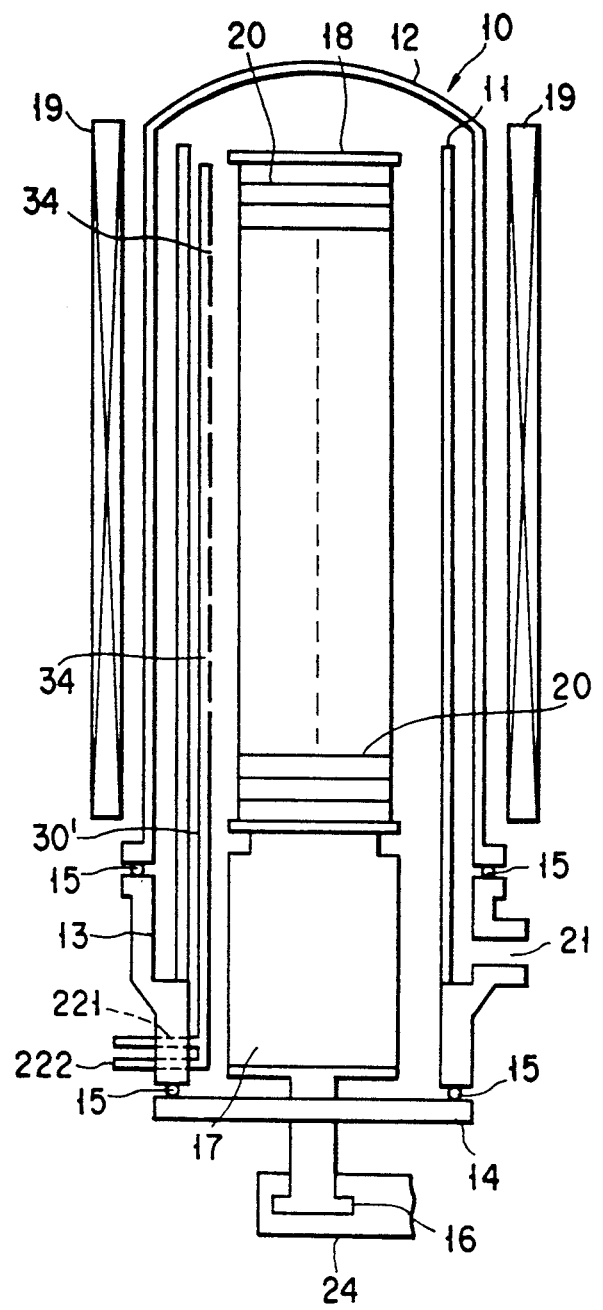
FIG. 1 is a cross-sectional view schematically showing a vertical-type CVD according to an embodiment of the present invention.
Figure 9:
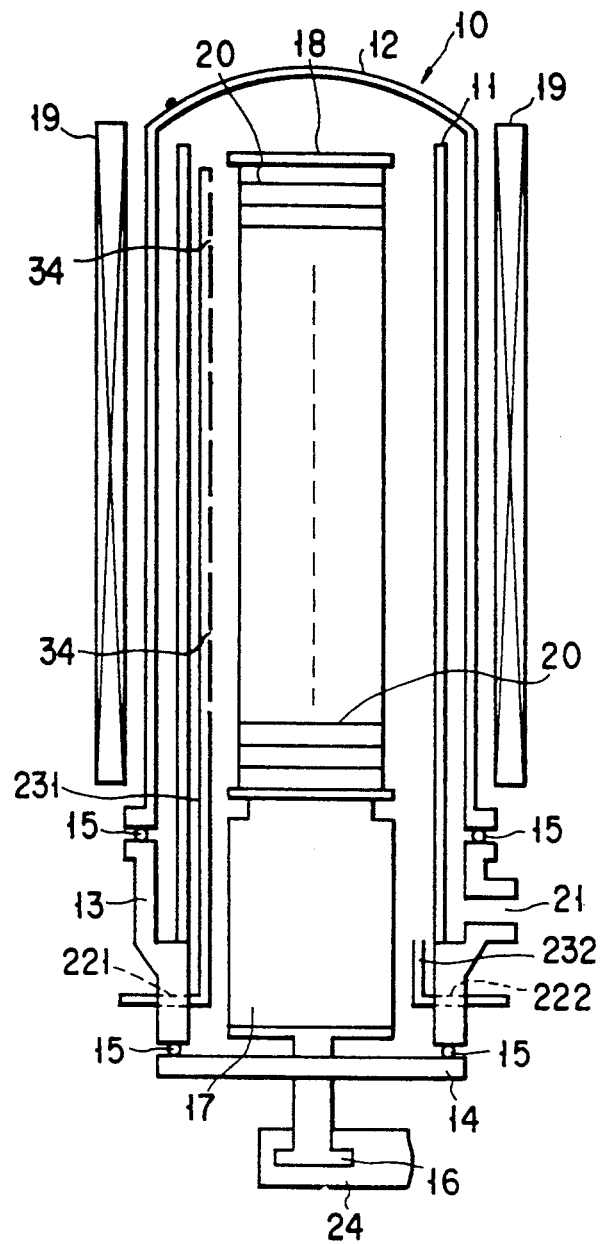
FIG. 9 is a cross-sectional view schematically showing a conventional vertical-type CVD apparatus.
Figure 12:
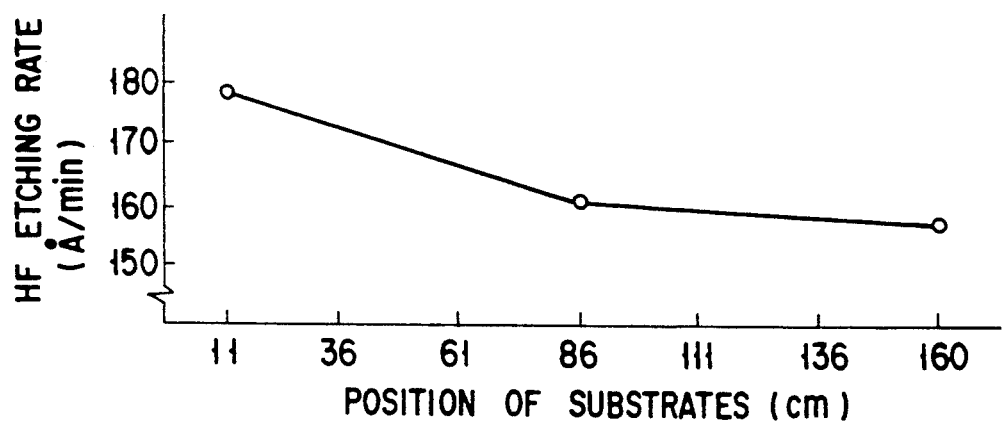
FIG. 12 shows a change in an etching rate of a film provided by means of the CVD apparatus of FIG. 9.
Figure 13:
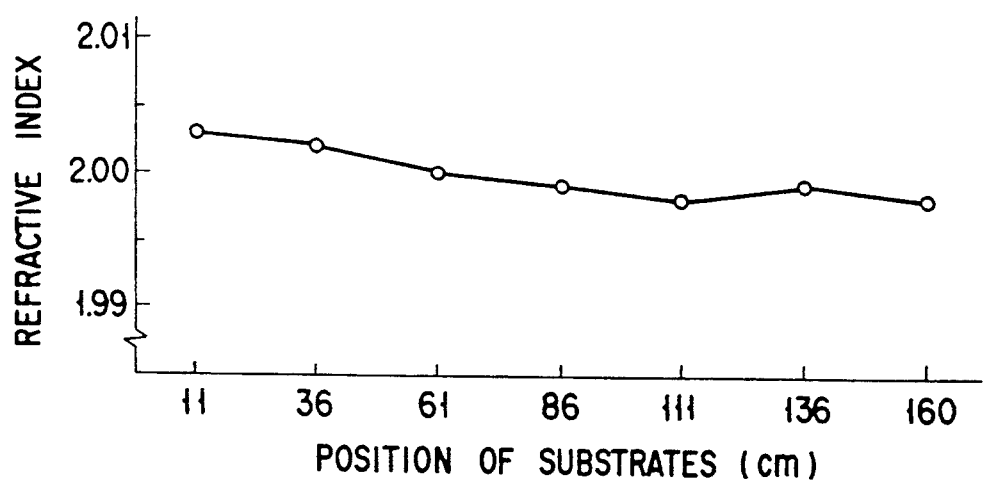
FIG. 13 shows a change in a refractive index of a film formed by means of the CVD apparatus of FIG. 9.

As mentioned previously, the conventional vertical-type CVD apparatus shown in FIG. 9 employs two gas inlet tubes 231 and 232, whereas the vertical-type CVD apparatus shown in FIG. 1 employs, in place of the tubes 231 and 232, a gas inlet tube 30' whose proximal end portion is divided into two branches as shown in FIGS. 11A and 11B and whose distal end is closed. The gas inlet tube 30' has a plurality of gas injection holes 34. The direction of each gas injection hole 34 is set as explained hereinafter. The parts of the apparatus shown in FIG. 1 and corresponding to those of the conventional apparatus shown in FIG. 9 are denoted by the same reference numerals.

In the vertical-type apparatus shown in FIG. 1, raw gases are supplied independently through gas inlet ports 221 and 222 of the gas inlet tube 30'. The gases are mixed with each other while flowing within the inlet tube (normally, raw gases are mixed in the vicinity of a branch portion 31 where no dust and by-products are produced), and the mixed gas is introduced into a reaction chamber through the gas injection holes 34.

Figure 2:
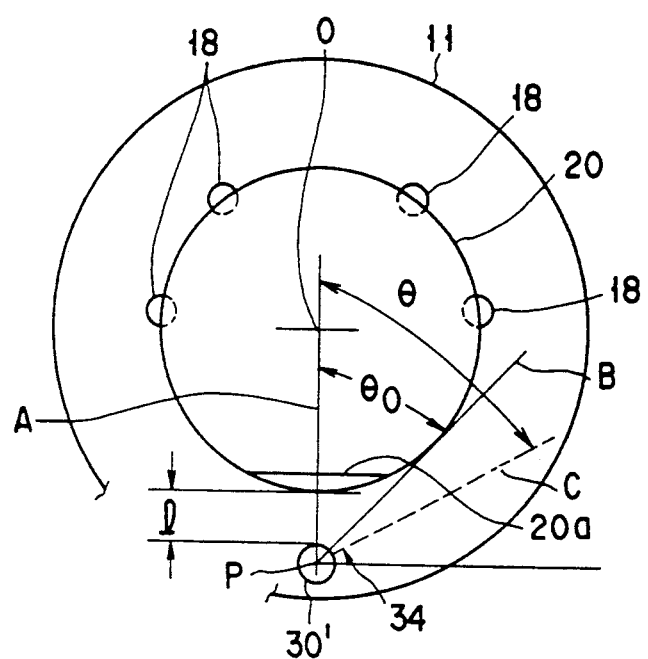
FIG. 2 is a cross-sectional view showing the middle portion of the CVD apparatus of FIG. 1.

FIG. 2 schematically shows a plan view of the middle portion of the reduced pressure CVD apparatus 10. 11 is the inner tube, and 18 is the boat for holding a plurality of substrates. 20 is one of 6-inch silicon substrates (wafers) which are horizontally held by the boat 18, and 20a is the orientation flat of the substrate 20. 30' is a gas inlet tube, and 34 is a plurality of gas injection holes of the gas inlet tube 30'. A is a straight line connecting a center P of the gas inlet tube 80' to a center point O of the substrate, which is given as a reference line. B is a straight line connecting the center P of the gas inlet tube and a given point on the periphery of the substrate 20 (i.e. the tangent connecting the center P of the gas inlet tube to the periphery of the substrate 20 which is substantially circular). $\theta$ is a direction of one gas injection hole 34 with respect to the reference line A, which is given by angle between the reference line A and a straight line C passing through the center P of the gas inlet tube. $\theta_0$ is an angle given by the tangent line B, passing through the center P of the gas inlet tube, with respect to the reference line A. l is a distance between an edge of the gas inlet tube 30' and an edge of the substrate 20. The direction $\theta$ of the gas injection hole 34 of the gas inlet tube 30' is set in a predetermined range which is larger than $\theta_0$. Each of the gas injection holes 34 is arranged in the same direction or different directions within the predetermined range.

FIGS. 3 to 6 show experimental results on a distribution of a thickness of deposited films where the direction $\theta$ of the gas injection hole 34, the distance l between the gas inlet tube 30' and the substrate 20 and the diameter d of the gas injection hole 34 were changed as parameters when a plurality of substrates 20 were placed in the uniformly-heated zone of the vertical-type CVD apparatus illustrated in FIG. 1, and raw gases (e.g. dichlorosilane gas and ammonium gas) were supplied to form silicon nitride films on the substrates 20.

Figure 3:
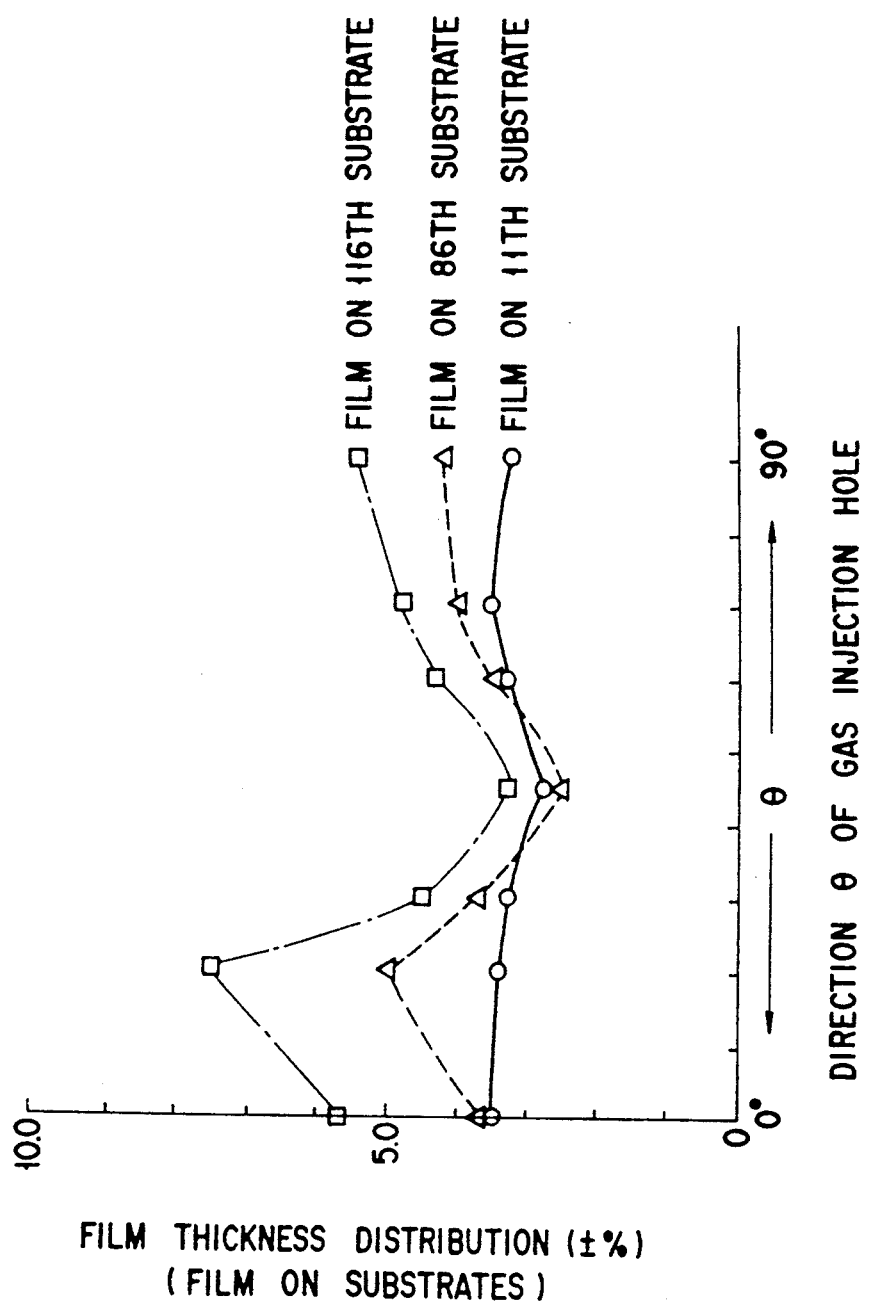
FIG. 3 shows a relation between a direction $\theta$ of a gas injection hole and a distribution of a film thickness when a film is deposited on semiconductor substrates by using the CVD apparatus of FIG. 1.

To be specific, FIG. 3 shows an example of the results where $\theta$ is changed in the range of $0° < \theta \leq 90°$, (the angle $\theta_0$ is changed in the range of 0 to $\pm 45°$). / In this case, the distance l between the gas inlet tube and the substrate, and the diameter d of each gas injection hole are set to optimum values (the distance l and the diameter d are given by 15 mm and 1.0 mm, respectively).

When the angle $\theta$ is counterclockwise changed in the range of $0° < \theta_0 \leq 90°$ with respect to the the reference line A, the same result as that shown in FIG. 3 is obtained.

It can be understood from FIG. 3 that the smallest variation in the thickness of the films (on the substrates) is provided when the angle $\theta$ is equal to the angle $\theta_0$ ($\theta_0=0°$, i.e. $\theta=45°$). It can be further understood from FIG. 3 that the variation in the thickness of the films deposited on the substrates is relatively small (equal to or less than 5% corresponding to the practical range of the film thickness distribution) when the angle $\theta$ is changed in the range of $25° \leqq \theta \leqq 80°$ with respect to the reference line A.

Figure 4:
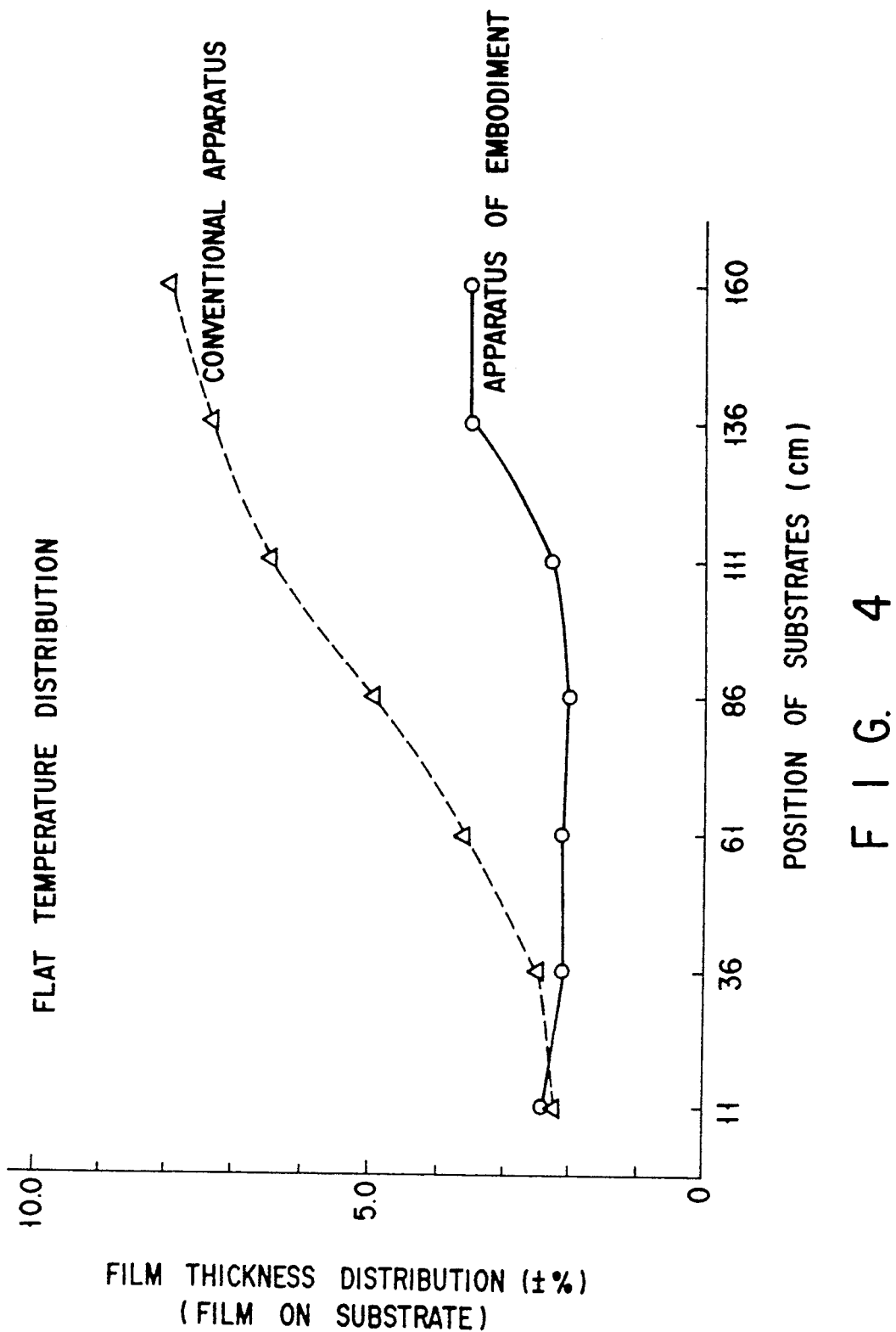
FIG. 4 shows a relation between a substrate position and a distribution of a film thickness when a film is deposited on semiconductor substrates by using the CVD apparatus of FIG. 1.

FIG. 4 shows a distribution of the film thickness relative to the positions of substrates 20 (i.e. the distance from the inlet port of the reaction chamber) when the silicon nitride film was deposited on the substrates by means of both the CVD apparatus of this embodiment and the conventional CVD apparatus, respectively, while keeping the uniformly-heated zone at a substantially constant temperature. In this case, the direction $\theta$ of the gas injection hole, the distance l between the gas inlet tube and the substrate, and the diameter d of the gas injection hole are optimized (e.g., $\theta$ is given by 45° that is the same direction as the tangent B, l is 15 mm and d is 1.0 mm, respectively).

It can be understood from FIG. 4 that the variation in the thickness of the films relative to positions of the substrates according to the CVD apparatus of the embodiment is much smaller than that in the case of the conventional apparatus.

Figure 5:
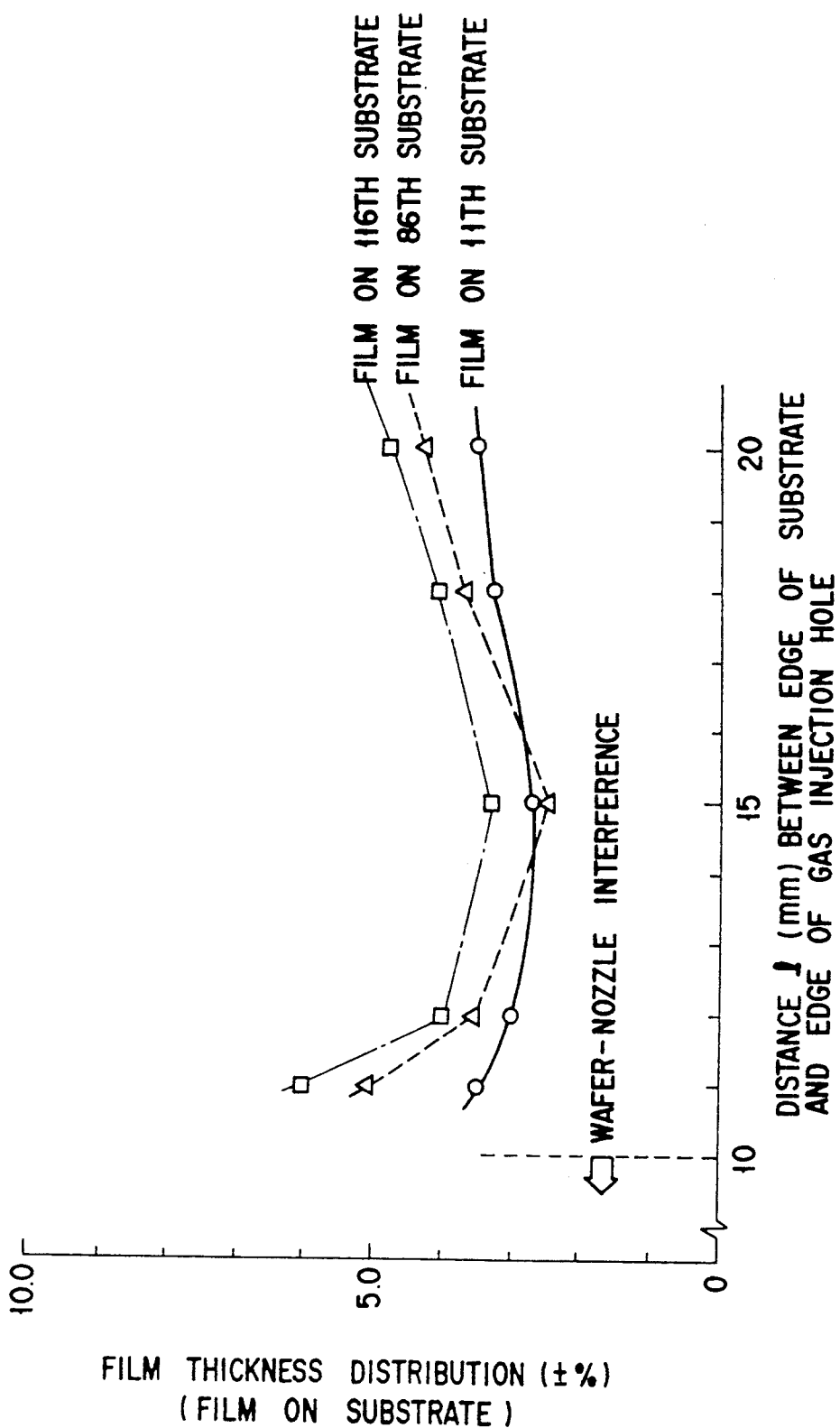
FIG. 5 shows a relation between a distance from an edge of a substrate to an edge of the gas injection hole and a distribution of a film thickness when a film is deposited on semiconductor substrates by using the CVD apparatus of FIG. 1.

FIG. 5 shows an example of the results where the distance l between the edge of the gas inlet tube 30' and the edge of the substrate 20 is varied in the range of 10 to 20 mm (it is impossible to reduce the distance l to below 10 mm because unwanted interference occurs between the substrate and the gas injection holes). In this case, the direction $\theta$ of the gas injection hole and the distance l between the gas inlet tube and the substrate are optimized (e.g. $\theta$ is given by 45° that is the same direction as the tangent B, and l is 15 mm respectively.).

It can be clearly understood from FIG. 5 that a desirable result is obtained when the distance l is in the range of 12 to 18 mm.

Figure 6:
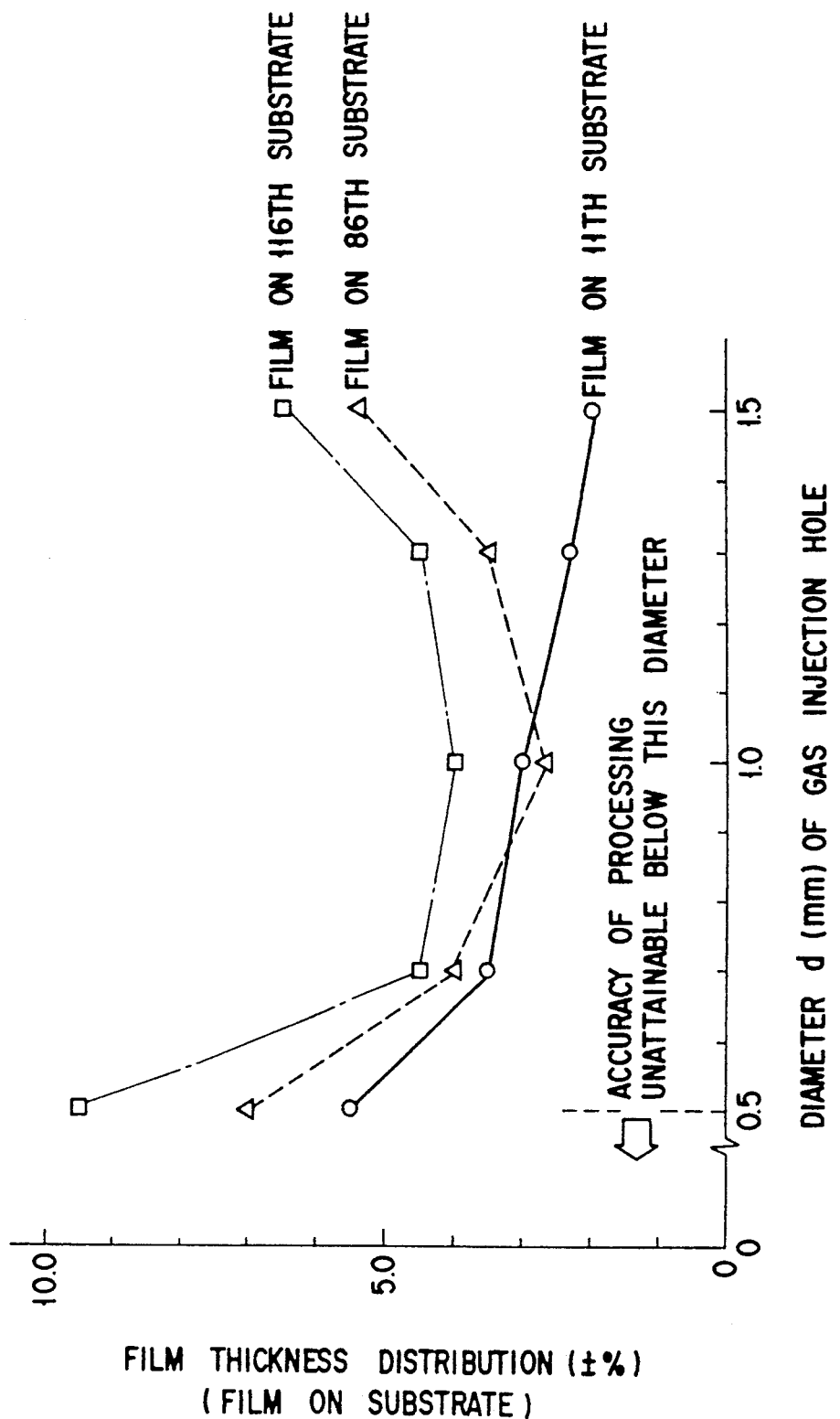
FIG. 6 shows a relation between a diameter of the gas injection hole and a distribution of a film thickness when a film is deposited on semiconductor substrates by using the CVD apparatus of FIG. 1.

FIG. 6 shows an example of the results where the diameter d of the gas injection hole is varied in the range of 0.5 to 1.5 mm. (In general, it is difficult to form a gas injection hole having a diameter less than 0.5 mm, since considerably high accurate machining is required.) In this case, the direction $\theta$ of the gas injection hole and the distance l between the gas inlet tube and the substrate are optimized (e.g. $\theta$ is given by 45° that is the same direction as the tangent B, and l is 15 mm).

It can be understood from FIG. 6 that a desirable result is obtained when the diameter d is in the range of 0.7 to 1.3 mm.

Figure 7:
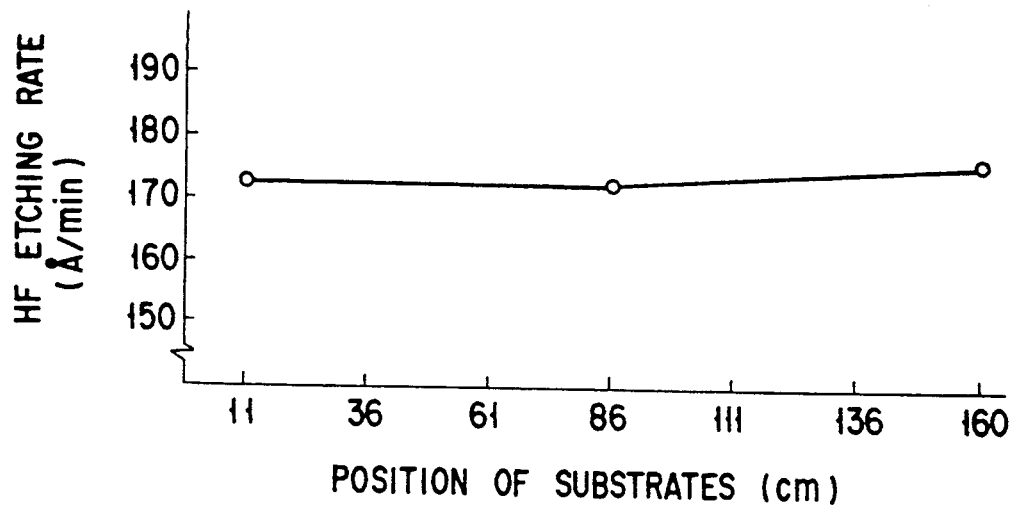
FIG. 7 shows a relation between a substrate position and an HF etching rate of a film when the film is deposited on semiconductor substrates by using the CVD apparatus of FIG. 1.
Figure 8:
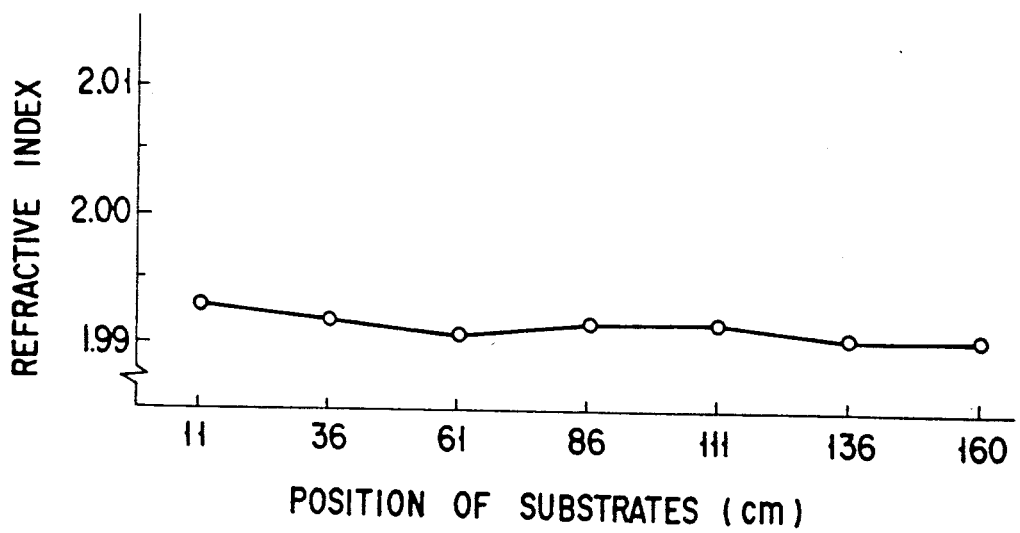
FIG. 8 shows a relation between a substrate position and a refractive index of a film when the film is deposited on semiconductor substrates by using the CVD apparatus of FIG. 1.

FIGS. 7 and 8 show examples of the results where the variation in characteristics of the silicon nitride film among the substrates is investigated when the silicon nitride film was deposited on each substrate 20 under optimized conditions of $\theta$, l, and d.

To be specific, FIG. 7 shows an example of the results where the distribution of the HF etching rate of the silicon nitrdie films relative to the positions of the substrates (the distance from the inlet port of the reaction chamber) was measured, and FIG. 8 shows an example of the results where the distribution of the refractive index of the silicon nitride film relative to the positions of the substrates on the boat (the distances from the inlet port of the reaction chamber) was measured.

It can be apparent from FIGS. 7 and 8 that the film thickness and the composition of each film are substantially uniform among the substrates.

Even if two gas inlet tubes 231 and 232 as employed in the CVD apparatus of FIG. 9 are used instead of the gas inlet tube 30' in the CVD apparatus of FIG. 1, the similar advantages to the embodiment described above will be attained by setting the direction $\theta$ of each gas injection hole of one gas inlet tube 231 as mentioned previously.

To set the direction of each gas injection hole as described above is not always limited to the deposition of CVD films such as silicon nitride films. For example, such a technique will be applicable to introducing an impurity gas ($PH_3$ gas, $B_2H_6$ gas, etc) into a reaction chamber so as to dope a polysilicon film with its impurity, or to employing a CVD film itself as a part of a semiconductor. As mentioned above, according to the vertical-type CVD apparatus of the present invention, CVD films which are substantially uniform in thickness and composition can be formed on a plurality of substrates. The CVD films thus formed can be treated to have substantially the same state in the case where they are etched. Further, according to the present invention, the differences in the characteristics of the films on the wafers are small even in the case of using a CVD film itself as a part of the semiconductor.

It is further understood by those skilled in the art that the foregoing description is only of the preferred embodiment and that various changes and modifications may be made in the invention without departing from the spirit and scope thereof.

What is claimed is:

1. A vertically oriented CVD apparatus for depositing a silicon nitride film on a plurality of semiconductor wafers comprising:
    a reaction chamber including an inner tube having an opened distal end and an outer tube having an exhaust port at a lower portion thereof and covering the inner tube;
    a boat means, having a top, vertically placed in the inner tube to horizontally support the plurality of semiconductor wafers as a stack; and
    a gas inlet tube including a plurality of gas injection holes along a longitudinal axis thereof and extending along a longitudinal side of the boat means to introduce a reaction gas, adapted to deposit a silicon nitride film on each of the plurality of semiconductor wafers, into the reaction chamber; wherein
    the reaction gas is exhausted from the opened distal end of the inner tube through the exhaust port, and
    a direction of each of the gas injection holes is set at an angle $\theta$ with respect to a reference line given by a straight line connecting a center of the gas inlet tube to a center of one of the plurality of semiconductor wafers, the angle $\theta$ being defined by $\theta_0 \leqq \theta \leqq 90°$ where $\theta_0$ is an angle between a line tangent to an outer edge of the one of the plurality of semiconductor wafers and passing through the center of the gas inlet tube and the reference line.

2. The vertically oriented CVD apparatus according to claim 1, wherein the gas inlet tube extends to the top of the boat means.

3. The vertically oriented CVD apparatus according to claim 1, wherein the gas inlet tube is closed at an end thereof.

4. The vertically oriented CVD apparatus according to claim 1, wherein the plurality of gas injection holes introduce the reaction gas into a uniformly heated zone of the reaction chamber.

5. The vertically oriented CVD apparatus according to claim 4, wherein the direction of the plurality of gas injection holes is the same.

6. The vertically oriented CVD apparatus according to claim 4, wherein the direction of the plurality of gas injection holes is different.

7. The vertically oreinted CVD apparatus according to claim 1, further including a heating means disposed outside the outer tube to provide a uniformly heated zone.

8. The vertically oriented CVD apparatus according to claim 1, wherein the gas inlet tube includes two gas inlet ports through which two raw gases are introduced into the reaction chamber as the reaction gas.

9. The vertically oriented CVD apparatus according to claim 1, wherein a distance l between an edge of said gas inlet tube and an edge of the one of the semiconductor wafers is 12 to 18 mm while a diameter d of each of the gas injection holes is 0.7 to 1.3 mm.

10. The vertically oriented CVD apparatus according to claim 1, wherein the angle $\theta$ is $\theta_0 \leq \theta \leq 80°$.

* * * * *

UNITED STATES PATENT AND TRADEMARK OFFICE
CERTIFICATE OF CORRECTION

PATENT NO. : 5,252,133
DATED : October 12, 1993
INVENTOR(S) : Shinji Miyazaki et al.

It is certified that error appears in the above-indentified patent and that said Letters Patent is hereby corrected as shown below:

Claim 7, column 7, line 12, change "oreinted" to --oriented--.

Signed and Sealed this

Sixth Day of September, 1994

Attest:

BRUCE LEHMAN

Attesting Officer     Commissioner of Patents and Trademarks